(12) United States Patent
Mima (10) Patent No.: US 11,618,268 B2
(45) Date of Patent: Apr. 4, 2023

(54) LIGHT IRRADIATOR AND PRINTING DEVICE

(71) Applicant: KYOCERA CORPORATION, Kyoto (JP)

(72) Inventor: Takayuki Mima, Yasu (JP)

(73) Assignee: KYOCERA CORPORATION, Kyoto (JP)

( * ) Notice: Subject to any disclaimer, the term of this patent is extended or adjusted under 35 U.S.C. 154(b) by 78 days.

(21) Appl. No.: 17/425,939

(22) PCT Filed: Jan. 28, 2020

(86) PCT No.: PCT/JP2020/002999
§ 371 (c)(1),
(2) Date: Jul. 26, 2021

(87) PCT Pub. No.: WO2020/158738
PCT Pub. Date: Aug. 6, 2020

(65) Prior Publication Data
US 2022/0161574 A1 May 26, 2022

(30) Foreign Application Priority Data

Jan. 30, 2019 (JP) .............................. JP2019-014171

(51) Int. Cl.
*B41J 11/00* (2006.01)
*B41J 29/377* (2006.01)

(52) U.S. Cl.
CPC ....... *B41J 11/00218* (2021.01); *B41J 29/377* (2013.01)

(58) Field of Classification Search
CPC ................ B41J 11/00218; B41J 29/377; B41J 11/00214; B41J 11/0021; B41J 2/01; B41F 23/0406; B41F 23/045; H01L 33/642; B01J 19/12
See application file for complete search history.

(56) References Cited

U.S. PATENT DOCUMENTS 9,662,906 B2 5/2017 Kobayashi
2017/0205062 A1* 7/2017 Watanabe ............. F21V 23/005

FOREIGN PATENT DOCUMENTS

| JP | 3190306 U | 5/2014 |
|----|-----------|--------|
| JP | 3196411 U | 3/2015 |
| JP | 2016157889 A | 9/2016 |

(Continued)

*Primary Examiner* — Bradley W Thies
(74) *Attorney, Agent, or Firm* — Hauptman Ham, LLP (57) ABSTRACT

A light irradiator includes a light source, a heat-dissipating member thermally connected to the light source, a drive including a drive circuit for the light source, a housing having vents and an irradiation opening for light from the light source to pass, and a blower. The rectangular housing has a first surface having a first side with a first dimension and a second side with a second dimension, a second surface having the second side and a third side with a third dimension, and a third surface having the first and third sides. The opening is in the first surface. A first vent and a second vent are in the second surface, with the first vent nearer the opening, and the second vent opposite to the opening. The heat-dissipating member faces the first vent. The drive is between the first and second vents. The blower faces the second vent.

5 Claims, 4 Drawing Sheets

(56) References Cited

FOREIGN PATENT DOCUMENTS

| JP | 2018134815 A | 8/2018 |
|---|---|---|
| KR | 1020170121530 A | 11/2017 |
| WO | 2012149036 A1 | 11/2012 |
| WO | 2013130861 A1 | 9/2013 |
| WO | 2016042974 A1 | 3/2016 |

* cited by examiner

LIGHT IRRADIATOR AND PRINTING DEVICE

RELATED APPLICATIONS

The present application is a National Phase of International Application No. PCT/JP2020/002999, filed Jan. 28, 2020, and claims priority based on Japanese Patent Application No. 2019-014171, filed Jan. 30, 2019.

FIELD

The present disclosure relates to a light irradiator and a printing device including the light irradiator.

BACKGROUND

A light irradiator includes a light source and a drive substrate for driving the light source both accommodated in a housing. Examples of the light source include lamps or light-emitting diodes (LEDs) that emit ultraviolet rays or infrared rays. Such light irradiators are commonly used in healthcare including sterilization, assembly production including curing of adhesives or ultraviolet curable resins in electronic packaging, drying including irradiation of targets with infrared rays for efficient drying, and printing including drying or curing of inks.

Among different purposes, light irradiators for printing are designed for higher output of light for recent faster printing and are also to be downsized for space-saving.

A light source included in a light irradiator generates heat when emitting light. The light source emitting more light may generate more heat. To effectively dissipate heat and also downsize the light irradiator, the light irradiator may further include a heat sink (heat-dissipating member) thermally connected to the light source and accommodated together in the housing (refer to, for example, Japanese Registered Utility Model Nos. JP 3190306 U and JP 3196411 U).

A light irradiator may include a light source and a drive, as well as a heat-dissipating member (e.g., a heat sink) and further a blower, all accommodated in a single housing. Such a light irradiator may fail to be downsized while achieving sufficient heat dissipation.

A light irradiator included in a printing device may be designed thinner for downsizing. More specifically, the light irradiator may be generally rectangular and have a large dimension (width) in the width direction of a print medium being fed, a small dimension (thickness) in the feed direction, and a dimension (length) in the direction orthogonal to the print medium larger than the width and the thickness. However, such a thin light irradiator may fail to have an effective passage of air flowing into and out of the housing for cooling the light source.

A thin, small, and high-output light irradiator that can efficiently cool the light source is awaited.

BRIEF SUMMARY

A light irradiator according to an aspect of the present disclosure includes a light source including a plurality of light-emitting elements, a heat-dissipating member thermally connected to the light source, a drive including a drive circuit for the light source, a housing accommodating the light source, the heat-dissipating member, and the drive, and having a plurality of vents and an irradiation opening to allow light from the light source to pass, and a blower that blows air to generate airflow into and out of the housing through the plurality of vents. The housing is rectangular and includes a first surface having a first side with a first dimension and a second side with a second dimension greater than the first dimension, a second surface having the second side and a third side with a third dimension greater than the second dimension, and a third surface having the first side and the third side. The irradiation opening is in the first surface. The plurality of vents includes a first vent and a second vent in the second surface. The first vent is located nearer the irradiation opening than the second vent, and the second vent is located near an opposite end from the irradiation opening. The light source is located adjacent to the irradiation opening. The heat-dissipating member faces the first vent. The drive is located between the first vent and the second vent. The blower faces the second vent.

A printing device according to another aspect of the present disclosure includes the light irradiator according to the above aspect of the present disclosure, a feeder that feeds a print medium to be irradiated with light emitted from the light irradiator through the irradiation opening, and a printing unit upstream from the light irradiator in a feed direction of the print medium.

DETAILED DESCRIPTION

A light irradiator according to one or more embodiments of the present disclosure includes a rectangular housing having first to third surfaces as described above. An irradiation opening is in the first surface. A first vent and a second vent are in the second surface. The first vent is located nearer the irradiation opening than the second vent, and the second vent is located near an opposite end from the irradiation opening. A light source is located adjacent to the irradiation opening. A heat-dissipating member faces the first vent. A drive is located between the first vent and the second vent. A blower faces the second vent. This structure effectively dissipates heat from the heat-dissipating member and the drive with air flowing through the thin housing and efficiently cools the light source. The light irradiator with this structure is thin, small, and has improved light output.

A printing device according to one or more embodiments of the present disclosure includes the thin and small light irradiator with improved cooling performance according to one or more embodiments of the present disclosure. The printing device is thus small and efficient.

A light irradiator and a printing device according to one or more embodiments of the present disclosure will now be described with reference to the drawings.

Figure 1A:
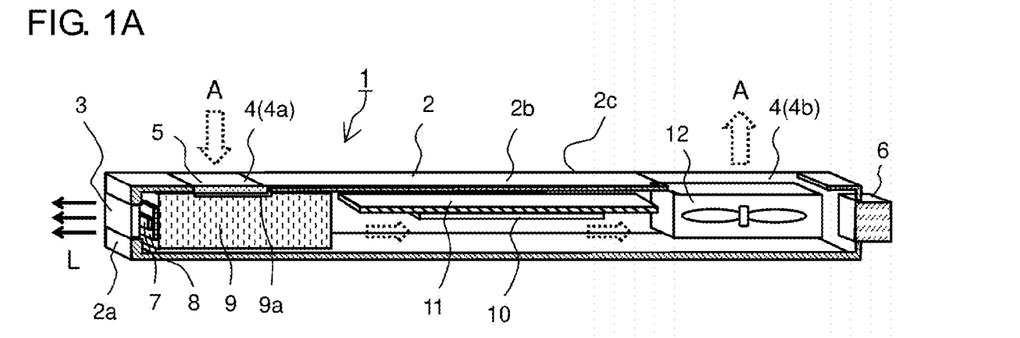
FIG. 1A is a schematic partial perspective view in a section of a light irradiator according to an embodiment of the present disclosure.
Figure 1B:
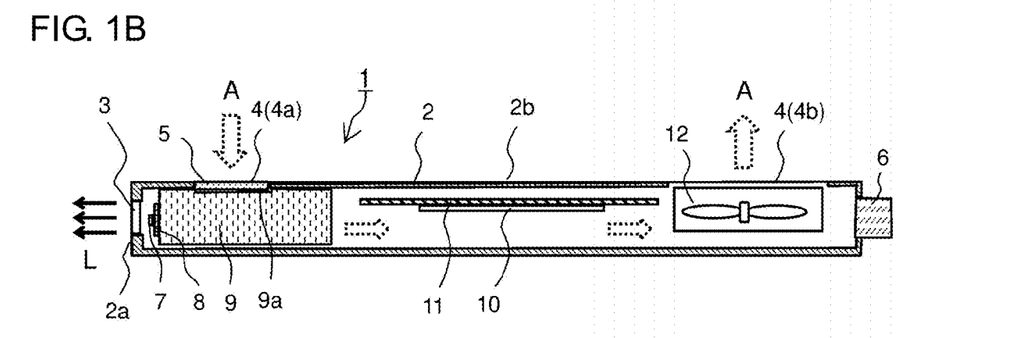
FIG. 1B is a cross-sectional view of the light irradiator.
Figure 1C:
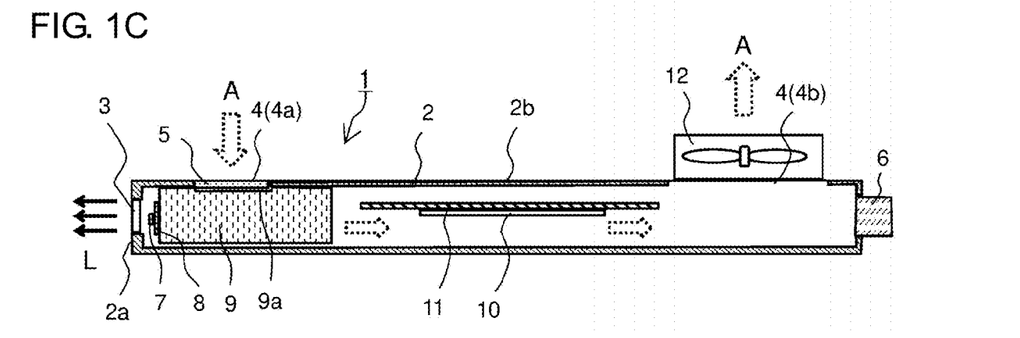
FIG. 1C is a schematic cross-sectional view of a light irradiator according to another embodiment.

FIGS. 1A to 1C schematically show light irradiators according to embodiments of the present disclosure. FIG. 1A is a partial perspective view in a section. FIG. 1B is a cross-sectional view. FIG. 1C is a schematic cross-sectional view in another embodiment similar to FIG. 1B. The directional terms such as up and down (or vertical) and right and left (or lateral) are used herein for clarity without limiting the structures or operating principles of the light irradiator and the printing device.

A light irradiator 1 shown in FIGS. 1A and 1B includes a light source 7 including multiple light-emitting elements, a heat-dissipating member (heat sink) 9 thermally connected to the light source 7, a drive 11 including a drive circuit 10 for the light source 7, and a housing 2 accommodating the light source 7, the heat-dissipating member 9, and the drive 11. The housing 2 has multiple vents 4 (4a and 4b) and an irradiation opening 3 that allows light from the light source 7 to pass. The light irradiator 1 includes a blower 12 for blowing air to generate airflow into and out of the housing 2 through the vents 4 (4a and 4b). The blower 12 includes a cooling fan.

The blower (cooling fan) 12 in the housing 2 generates flow of the outside air (air) through the first vent 4a as an inlet and the second vent 4b as an outlet. The blower 12 facilitates effective dissipation of heat from the heat-dissipating member 9 and the drive 11. The blower 12 is typically an axial fan with a small size that produces a large airflow. The blower 12 may be any other type of fan.

The housing 2 includes a connector 6 on its surface opposite to the surface with the irradiation opening 3. The connector 6 is used to connect a wire to the drive 11 and direct the wire out of the housing 2. The drive 11 receives power from an external source and exchanges control signals with an external component through the connector 6. The drive circuit 10 in the drive 11 is electrically connected to the light source 7 with a light-source mounting substrate 8 in between using a wiring member (described later).

The housing 2 is rectangular and has a first surface 2a (the left end face in FIG. 1A) having a first side with a first dimension and a second side with a second dimension greater than the first dimension, a second surface 2b (the top surface in FIG. 1A) having the second side and a third side with a third dimension greater than the second dimension, and a third surface 2c (the farther lateral surface in FIG. 1A) having the first side and the third side. The housing 2 has the irradiation opening 3 in the first surface 2a, and the first vent 4a and the second vent 4b in the second surface 2b. The first vent 4a is located nearer the irradiation opening 3 than the second vent 4b, and the second vent 4b is located opposite to the irradiation opening 3. The light source 7 is located adjacent to the irradiation opening 3. The heat-dissipating member 9 faces the first vent 4a. The drive 11 is located between the first vent 4a and the second vent 4b. The blower 12 faces the second vent 4b.

The housing 2 defines the profile of the light irradiator 1. The housing 2 is formed from a metal or a plastic. The housing 2 in the present embodiment is rectangular and has the first surface 2a having the first side with the first dimension and the second side with the second dimension, the second surface 2b having the second side and the third side with the third dimension, and the third surface 2c having the first side and the third side. The housing 2 has the irradiation opening 3 in the first surface 2a to allow light from the light source 7 to be emitted outside. FIGS. 1A and 1B show three arrows on the left of the irradiation opening 3 to indicate light L being emitted. The housing 2 has the vents 4 (4a and 4b) in the second surface 2b. The first vent 4a is located nearer the irradiation opening 3 than the second vent 4b, and the second vent 4b is located opposite to the irradiation opening 3.

The housing 2 has a thin rectangular profile and has dimensions determined as appropriate to meet the specifications of the light irradiator 1. For example, the housing 2 has the first side with the first dimension (corresponding to the thickness of the housing 2) of 20 to 40 mm, the second side with the second dimension (corresponding to the width of the housing 2) of 80 to 120 mm, and the third side with the third dimension (corresponding to the length of the housing 2) of 120 to 250 mm. The housing 2 is not limited to the above dimensions and may simply satisfy (first dimension)<(second dimension)<(third dimension). The dimensions may be determined as appropriate for the use of the light irradiator 1. In one embodiment, the light irradiator 1 is included in a printing device such as a line printer that includes a printing unit having printheads with about the same width as the print medium. In this case, multiple light irradiators 1 may be arranged to have substantially the same width as the print medium and have dimensions determined as appropriate for the arrangement. In another embodiment, the light irradiator 1 is used for temporarily curing ultraviolet curable inks in multiple colors printed on the print medium using multiple printheads. In this case, the light irradiator 1 is located in each small area between the printheads for the colors. Thus, the thickness of each light irradiator 1 may be minimized and have a width corresponding to the width of each printhead (e.g., 120 mm). The light irradiator 1 can have the length with less restrictions. Thus, the light irradiator 1 may have the first dimension (thickness) of about 20 mm, the second dimension (width) of about 120 mm, and the third dimension (length) of about 220 mm. The light irradiator 1 with such dimensions is thin and small. The housing 2 may not be precisely rectangular. The housing 2 may have the sides and corners rounded or chamfered as appropriate for its use and specifications. In this case, the first to third dimensions may be defined as distances between two surfaces along the corresponding sides.

The housing 2 has the irradiation opening 3 in the first surface 2a to allow light from the light source 7 to be emitted outside to irradiate a target, such as a print medium. When the housing 2 has the first dimension (thickness) of about 20 mm as described above, the irradiation opening 3 may be about 13 mm along the first dimension. When the housing 2 has the second dimension of about 120 mm as described above, the irradiation opening 3 may be about 120 mm along the second dimension. The irradiation opening 3 may, but not limited to, extend across the first surface 2a of the housing 2 in the width direction (or the depth direction in FIG. 1A) for downsizing the housing 2 and providing continuous radiation with multiple housings 2 arranged adjacent to each other. The irradiation opening 3 is typically rectangular similar to the first surface 2a. However, the irradiation opening 3 may have any of various shapes in accordance with the use, including the shape of waves, an ellipse, or multiple circles. The irradiation opening 3 may have any dimensions determined appropriately within the dimensions of the first surface 2a in accordance with the use of the light irradiator 1. The irradiation opening 3 is typically located in the central portion including the center of the first surface 2a of the housing 2. However, the irradiation opening 3 may be open toward the light source 7 at a position offset from the center of the first surface 2a. The housing 2 may include a cover for the irradiation opening 3 as in the present embodiment. The cover may be formed from a material that transmits light from the light source 7, such as glass or a heat-resistant plastic.

The housing 2 has the vents 4 in the second surface (top surface) 2b. The vents 4 allow air to flow into and out of the housing 2, or in other words, allow the outside air to flow into and out of the housing 2. The vents 4 include the first vent 4a and the second vent 4b in the second surface 2b. In the second surface 2b, the first vent 4a is located nearer the irradiation opening 3 in the first surface 2a than the second vent 4b, and the second vent 4b is located near an end opposite to the irradiation opening 3.

The light irradiator 1 includes the heat-dissipating member (heat sink) 9 located opposite to the irradiation opening 3 from the light source 7 and thermally connected to the light source 7 in the housing 2. The heat-dissipating member 9 faces the first vent 4a. In the example shown in FIGS. 1A and 1B, the heat-dissipating member 9 is on the right of the light source 7 and thermally connected to the light source 7 with the light-source mounting substrate 8 incorporating the light source 7 in between. The housing 2 includes the drive 11 located between the first vent 4a and the second vent 4b. The drive 11 includes the drive circuit 10. The blower 12, which is a cooling fan, faces the second vent 4b.

Thus, the housing 2 has, near its both ends, the first vent 4a and the second vent 4b in the second surface 2b. The heat-dissipating member 9 faces the first vent 4a. The drive 11 is located between the first vent 4a and the second vent 4b. The blower 12 faces the second vent 4b. The blower 12 blows air outside the housing 2 through the second vent 4b to cause smooth flow of air A from outside through the first vent 4a, the heat-dissipating member 9, the drive 11, and the second vent 4b and then outside, as indicated by the broken line arrows in FIGS. 1A and 1B. This reduces stagnant air in the housing 2 and efficiently dissipates heat to cool the heat-dissipating member 9 and the drive 11. The thin and small light irradiator 1 can thus reduce heat from the light source 7.

In the example shown in FIGS. 1A and 1B, the blower 12 facing the second vent 4b is accommodated in the housing 2. In another embodiment, the blower 12 may be located outside the housing 2 to face the second vent 4b, as shown in a cross-sectional view of FIG. 1C similar to FIG. 1B. In some embodiments, the blower 12 may extend across the inside and outside the housing 2. The light irradiator 1 including the blower 12 accommodated in the housing 2 can be thinner and smaller. The blower 12 located outside the housing 2 can have higher positioning flexibility, and thus can have higher performance.

In the example shown in FIGS. 1A to 1C, the blower 12 extends parallel to the second surface 2b of the housing 2, or in other words, blows air orthogonally to the second surface 2b. In another embodiment, the blower 12 may be inclined with its right portion downward in the figures. The inclined blower 12 allows air to efficiently flow out of the housing 2. The inclined blower 12 also sends air away from the irradiation opening 3 through the second vent 4b, thus allowing the print medium to be less susceptible to the airflow.

The first vent 4a and the second vent 4b in the second surface 2b of the housing 2 may be at any of various positions or may have any shapes and sizes adjusted and determined as appropriate for the use and specifications of the light irradiator 1 and the specifications of the heat-dissipating member 9 and the blower 12. The second vent 4b, at which the blower 12 is located, may be about one to two times the size of the first vent 4a to allow efficient air circulation.

The housing 2 includes the light source 7 facing the irradiation opening 3 in the first surface 2a. The light source 7 may include, for example, a matrix array of light-emitting diodes (LEDs) on the light-source mounting substrate 8. The light source 7 may include GaN LEDs that emit ultraviolet rays. In another embodiment, the light source 7 may include GaAs LEDs that emit infrared rays. The light source 7 may be selectable in accordance with the wavelength to be used. The light-source mounting substrate 8 may be, for example, a ceramic wiring board. The ceramic wiring board has a base (insulating substrate) formed from ceramic, which resists heat. Thus, the ceramic wiring board may be used as the light-source mounting substrate 8 for the light source 7 that includes LEDs generating heat.

The heat-dissipating member 9 dissipates heat resulting from light emission from the light source 7. The heat-dissipating member 9 is thermally connected to the light source 7. The heat-dissipating member 9 is formed from a thermally conductive metal, such as aluminum or copper. The heat-dissipating member 9 may be formed by cutting a rectangular block of aluminum or copper to form multiple channels, with the remaining parts serving as fins and increasing the surface area. In some embodiments, the heat-dissipating member 9 is formed by attaching multiple sheets of aluminum or copper to a plate or block of aluminum or copper to serve as fins, between which outside air flows.

Figure 3A:
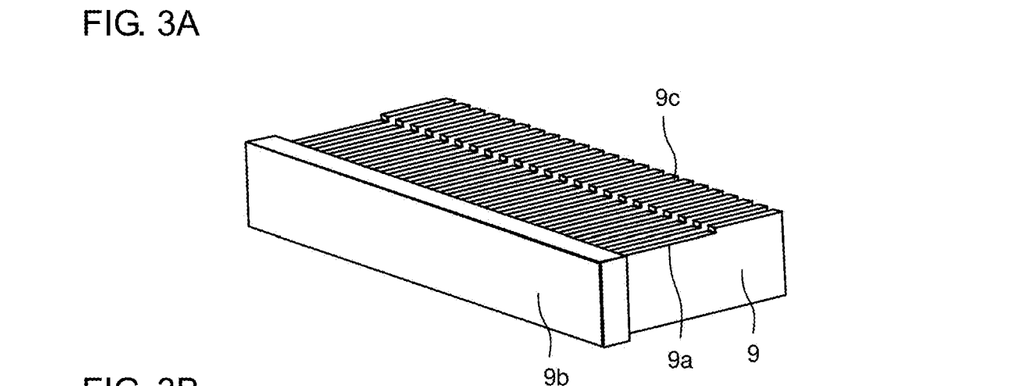
FIG. 3A is a perspective view of a heat-dissipating member for the light irradiator according to the embodiment of the present disclosure.
Figure 3B:
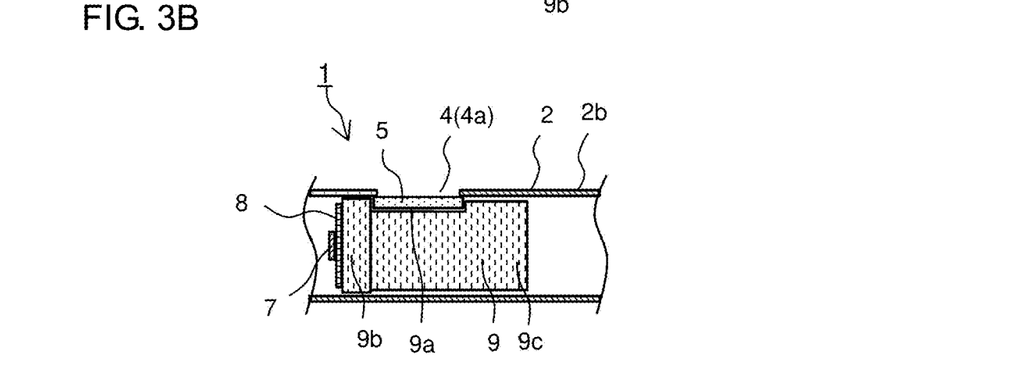
FIG. 3B is a schematic partial cross-sectional view of the light irradiator according to the embodiment of the present disclosure.

As shown in FIGS. 1A to 1C, in a perspective view of FIG. 3A, and in a schematic partial cross-sectional view of the light irradiator 1 of FIG. 3B, the heat-dissipating member 9 may occupy, in the housing 2, a space extending in the direction along the first side (along the first dimension) of the first surface 2a, and have a recess 9a recessed in the direction along the first side and facing the first vent 4a in the second surface 2b. The recess 9a can accommodate a filter 5 to face the first vent 4a. The filter 5 to reduce dust or other matter entering the housing 2 can be arranged in a space-efficient manner to achieve a thinner light irradiator 1.

The heat-dissipating member 9 occupying, in the housing 2, a space extending in the direction along the first side is not limited to the heat-dissipating member 9 fully occupying the space between the pair of second surfaces 2b in the housing 2. The heat-dissipating member 9 may substantially occupy a major part of the space with clearances left in the direction along the first side. For example, the housing 2 may include clearances around the heat-dissipating member 9 for attachment or detachment or for accommodating thermal expansion. The recess 9a may not face the entire first vent 4a. The recess 9a may have dimensions to partially face the first vent 4a and fit in the first vent 4a. In some embodiments, the recess 9a may be larger than and extend beyond the first vent 4a, or extend across the inside and outside the first vent 4a. The recess 9a may have any depth determined as appropriate for the shape and size of the filter 5.

The filter 5 may include, for example, a sponge or a nonwoven fabric. The filter 5 prevents foreign matter such as dust and dirt in outside air from entering the housing 2 and thus prevents the efficiency of the heat dissipation from the light source 7 or the drive 11 from decreasing due to such dust and dirt accumulating on the heat-dissipating member 9 or the drive 11. This improves the reliability of the light irradiator 1. The filter 5 also decelerates the flow of outside air around the vent 4.

For example, the filter 5 may have about a 1 mm greater width and a 1 mm greater length than the first vent 4a, and may have a thickness of about 1 mm. The recess 9a may have the same shape as the filter 5. The filter 5 thus allows passage of all the inlet air entering through the first vent 4a, thus reliably removing foreign matter from the inlet air. The filter 5 is received in the recess 9a to face the first vent 4a and in contact with the fins in the heat-dissipating member 9, allowing passage of all the inlet air entering through the first vent 4a between the fins in the heat-dissipating member 9 for efficient heat dissipation.

The heat-dissipating member 9 illustrated in FIGS. 3A and 3B includes a metal block 9b with multiple metal sheets 9c attached as fins. The sheets 9c have cutouts having the same shapes and sizes in their upper portions in the figures. The cutouts and the block 9b define the recess 9a. However, the recess 9a may have any other structure.

Figure 3C:
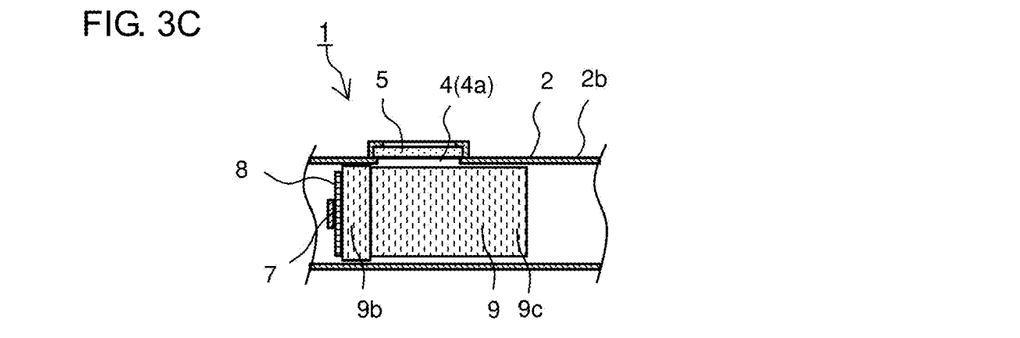
FIG. 3C is a schematic partial cross-sectional view of a light irradiator according to another embodiment.

The filter 5 may be attached in a different manner, without using the recess 9a in the heat-dissipating member 9. In another embodiment, the heat-dissipating member 9 in the housing 2 may have no recess as shown in a schematic partial cross-sectional view of FIG. 3C similar to FIG. 3B. The filter 5 facing the first vent 4a may be located outside the first vent 4a and covered by a frame.

The heat-dissipating member 9 may be connected to the light-source mounting substrate 8 with, for example, thermal grease, also called thermally conductive grease or heat dissipation grease. The grease increases the adhesion between the heat-dissipating member 9 and the light-source mounting substrate 8 to improve the thermal connection. This improves the efficiency of heat dissipation from the light source 7.

The light irradiator 1 includes the drive (drive substrate) 11 in the housing 2. The drive 11 is electrically connected to the light source 7 to drive the light source 7. The drive 11 includes the drive circuit 10 for supplying power to the light source 7 and controlling light emission. The drive 11 may also drive the blower (cooling fan) 12 and control the rotational speed of the fan in the blower 12 in accordance with heat generation from the light source 7. The drive 11 including the drive circuit 10 generates heat in driving the light source 7 or controlling the blower 12. Such heat is to be appropriately dissipated for cooling.

The drive 11 may include a heat-dissipating member, such as a heat sink, for dissipating heat from electronic components such as power transistors that easily reach high temperatures in, for example, the drive circuit 10. The housing 2 may include channels, fins, an air deflector, or other components on the inner surface around the drive 11 to allow the outside air to effectively flow to parts of the drive 11 that easily reach high temperatures. The drive 11 is typically a drive substrate including a wiring board. The drive circuit 10 is typically a drive circuit board including a wiring board.

As shown in FIGS. 1A to 1C, the drive 11 in the housing 2 may be located adjacent to the second surface 2b having the first and second vents 4a and 4b with the drive circuit 10 facing inward (toward the center) of the housing 2. In other words, the drive 11 in the housing 2 may be located nearer the inner wall of the second surface 2b having the first and second vents 4a and 4b in the direction along the first side with the first dimension. In this case, the drive 11 may have the drive circuit 10 facing inward (toward the center) of the housing 2, or in other words, facing the surface without the first and second vents 4a and 4b. Thus, a passage of the outside air, entering through the first vent 4a and flowing through the heat-dissipating member 9 to the blower 12, is effectively defined by the drive 11 located between the heat-dissipating member 9 and the blower 12 in the housing 2 and by the inner wall of the housing 2 opposite to the second surface 2b having the vents 4. The drive circuit 10 can be located in the passage of the outside air to allow efficient dissipation of heat from the drive circuit 10 and the drive 11. This improves the operational stability of the drive circuit 10 and the drive 11 and the reliability of the light irradiator 1.

To place the drive 11 in the housing 2 in this manner, the drive 11 may be fastened with, for example, screws with a base, a support, or a spacer placed as appropriate between the drive 11 and one or both of the inner walls of the pair of second surfaces 2b of the housing 2. The housing 2 includes a relatively large space between the drive 11 and the inner walls, and thus allows relatively flexible positioning of the fastening portions. The drive 11 may be fastened to one or both of the inner walls of the pair of third surfaces 2c of the housing 2 as appropriate with fasteners.

The drive 11 in the housing 2 may be located nearer the inner wall of the second surface 2b opposite to the second surface 2b having the first and second vents 4a and 4b in the direction along the first side with the first dimension. In this case, the drive 11 may have the drive circuit 10 facing inward in the housing 2, or in other words, facing the surface with the first and second vents 4a and 4b. Thus, a passage of the outside air, entering through the first vent 4a and flowing through the heat-dissipating member 9 to the blower 12, is effectively defined by the drive 11 located between the heat-dissipating member 9 and the blower 12 in the housing 2 and by the inner wall of the housing 2 at the second surface 2b having the vents 4. The drive circuit 10 can also be located in the passage of the outside air to allow efficient dissipation of heat from the drive circuit 10 and the drive 11.

Figure 2:
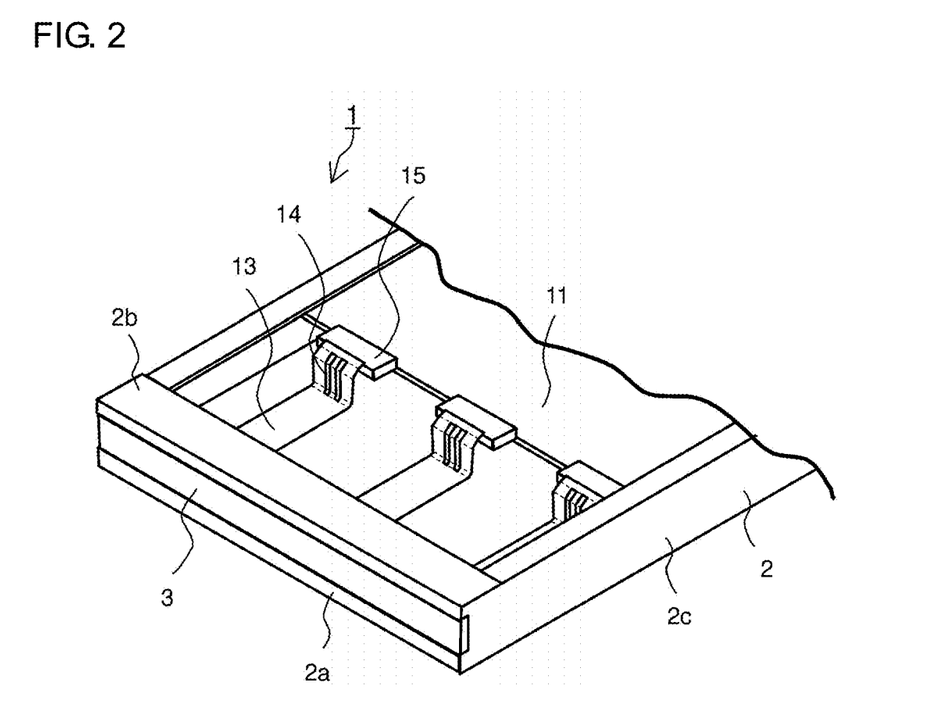
FIG. 2 is a schematic partial perspective view of the light irradiator according to the embodiment of the present disclosure.

The drive circuit 10 in the drive 11 is electrically connected to the light source 7 with the light-source mounting substrate 8 in between using a wiring member. An example of the wiring member is shown in a partial perspective view of FIG. 2. FIG. 2 partially eliminates the second surface 2b of the housing 2 to allow the drive 11 to be visible. The light irradiator 1 in the example shown in FIG. 2 includes flexible printed circuits (FPCs) as a wiring member 13 electrically connecting the drive 11 to a light source (not shown) facing the irradiation opening 3 in the housing 2. The FPCs include multiple wires and may carry a relatively high current. The FPCs, which serve as the flexible wiring member 13, may also be routed in the housing 2. As shown in FIG. 2, the wiring member 13 using FPCs extends from the light source and the light-source mounting substrate (not shown) thermally connected to the heat-dissipating member 9. The wiring member 13 further extends along the heat-dissipating member 9 while avoiding the heat-dissipating member 9. The wiring member 13 rises for electrical connection to the drive 11 after passing the heat-dissipating member 9. Components 15 are board-to-FPC connectors that connect the wiring member 13 to the drive 11.

The wiring member 13 using flexible FPCs is generally thin and wide. The wiring member 13 includes portions rising to the drive 11, which may interrupt the airflow through the heat-dissipating member 9 to the blower 12 in the housing 2 generated by the blower 12. Thus, the flexible wiring member 13 connecting the light source to the drive 11 may include multiple wires extending along the heat-dissipating member 9, and the wiring member 13 may have slits 14 between the wires in an area of airflow generated by the blower 12. The wiring member 13 may include multiple slits 14. The wiring member 13 with the slits 14 avoids interrupting air flowing through the heat-dissipating member 9, thus reducing the decrease in the heat dissipation efficiency.

The flexible wiring member 13 may extend along the heat-dissipating member 9. In this case, the wiring member 13 has portions along the heat-dissipating member 9 between the heat-dissipating member 9 and the inner wall of the housing 2 and portions rising to the drive 11. These portions may extend in direct contact with or slightly away from the heat-dissipating member 9. The wiring member 13 extending in direct contact with the heat-dissipating member 9 may save space. The wiring member 13 extending slightly away from the heat-dissipating member 9 may reduce interruption of airflow. Also, the wiring member 13 and the drive 11 may be effectively protected against heat. The wiring member 13 may have any layout with the slits 14 at any location and with any shape and size determined as appropriate for the design for appropriate airflow through the housing 2.

Figure 4:
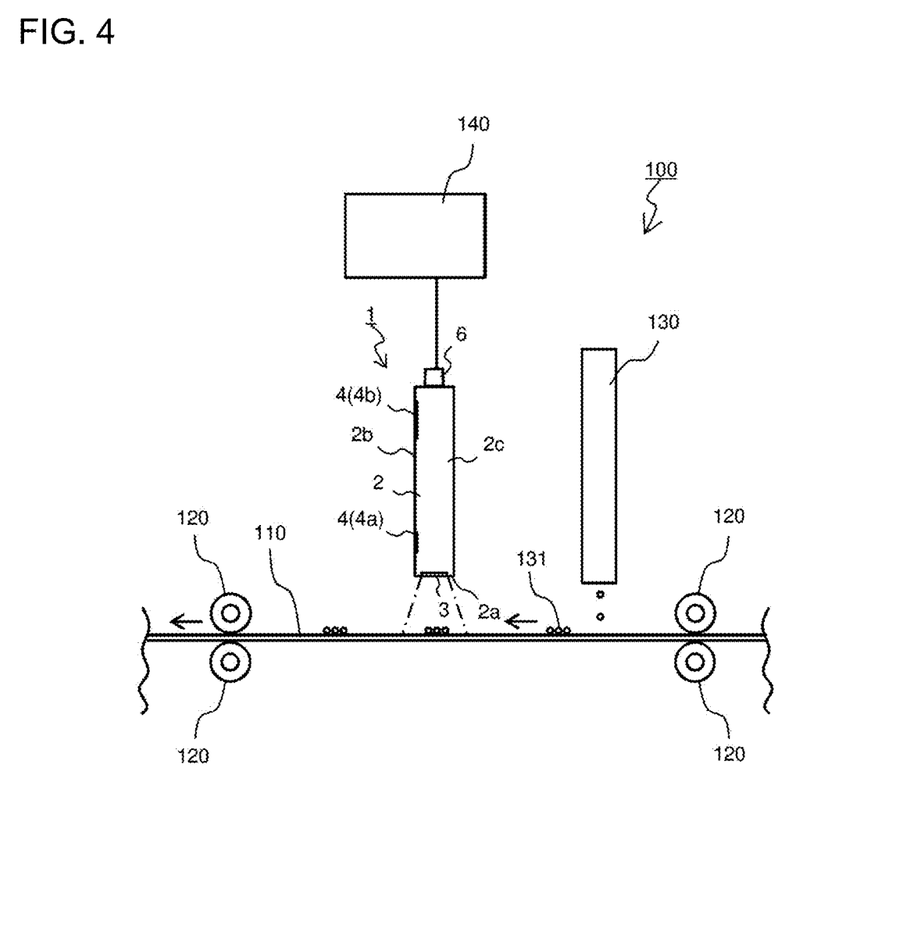
FIG. 4 is a schematic front view of a printing device according to the embodiment of the present disclosure.

FIG. 4 is a schematic front view of a printing device according to the embodiment of the present disclosure. A printing device 100 according to the embodiment shown in FIG. 4 includes the light irradiator 1 according to the embodiment of the present disclosure, a feeder 120 for feeding a print medium 110 to be irradiated with light emitted from the light irradiator 1 through the irradiation opening 3, and a printing unit 130 upstream from the light irradiator 1 in the feed direction of the print medium 110 to print on the print medium 110 being fed. In the printing device 100 in the present embodiment, the printing unit 130 includes inkjet heads that use, for example, ultraviolet curable inks.

The printing device 100 with this structure includes the thin, small light irradiator 1 and the printing unit 130 located close to each other. Thus, the printing device 100 is space-saving. The light irradiator 1 causes the outside air (air) to flow in through the first vent 4a and out through the second vent 4b. The light irradiator 1 allows the printing unit 130 and the print medium 110 to be less susceptible to the airflow when irradiating the printed print medium 110. Thus, the printing device 100 is small and reliable.

In the printing device 100, the feeder 120 feeds the print medium 110 from right to left in the figure. The feeder 120 in the present embodiment includes pairs of drive rollers upstream and downstream in the feed direction. A support for supporting the print medium 110 being fed may be provided close to or integral with the feeder 120. The printing unit 130 ejects, for example, an ultraviolet curable ink 131 onto the print medium 110 being fed and deposits the ink 131 on the surface of the print medium 110. The ink 131 may be deposited entirely or partially on the surface of the print medium 110 with any pattern as intended. In the printing device 100, the light irradiator 1 irradiates the ultraviolet curable ink 131 on the print medium 110 with ultraviolet rays to cure the ink 131. The photosensitive material used in the present embodiment is the ultraviolet curable ink 131. The photosensitive material in another embodiment may be a photoresist or a photocurable resin.

The light irradiator 1 is connected to a controller 140 for controlling light emission from the light irradiator 1. The controller 140 includes a memory storing information indicating the features of light relatively suitable for curing photo-curable inks 131 to be ejected from the inkjet heads as the printing unit 130.

Examples of the stored information include numerical values representing the wavelength distribution characteristics and the emission intensities (the emission intensity for each wavelength range) suitable for curing the inks 131 to be ejected in droplets. In the printing device 100 in the present embodiment, the controller 140 also adjusts the level of the drive current to be input into the multiple light-emitting elements in the light source 7 based on the information stored in the controller 140. The light irradiator 1 in the printing device 100 thus emits an appropriate amount of light in accordance with the characteristics of the ink used. This allows the ink 131 to be cured with relatively low-energy light.

The printing unit 130 in the present embodiment includes line inkjet heads. The inkjet heads 130 each include multiple ink ejection nozzles linearly arrayed to eject, for example, an ultraviolet curable ink. The inkjet heads as the printing unit 130 print onto the print medium 110 by ejecting ink from the ejection nozzles and depositing the ink 131 on the print medium 110 being fed in a direction orthogonal to the array of ejection nozzles in the depth direction.

The printing unit 130 is not limited to the line inkjet heads. For example, the printing unit 130 may include serial inkjet heads. In some embodiments, the printing unit 130 may include electrostatic heads that electrostatically deposit a developer (toner) on the print medium 110 charged with static electricity. In some embodiments, the print medium 110 may be immersed in a liquid developer or toner to deposit the toner on the print medium 110. In some embodiments, the printing unit 130 may include a brush or a roller for feeding a developer (toner).

When the printing device 100 in the present embodiment is a line printer, the light irradiator 1 may have the first surface 2a elongated in the depth direction in the figure in accordance with the width of the print medium 110. In some embodiments, multiple light irradiators 1 may be arranged in the depth direction in the figure in accordance with the width of the print medium 110.

In the printing device 100, the light irradiator 1 cures a photo-curable ink 131, or exposes a photosensitive ink 131 to light on the print medium 110 being fed by the feeder 120. The light irradiator 1 is downstream from the printing unit 130 in the feed direction of the print medium 110.

The printing device 100 in the present embodiment may use an ink 131 other than the ultraviolet-curable ink 131. For example, the printing device 100 may print a water- or oil-based ink 131 on the print medium 110 using the inkjet heads as the printing unit 130, and irradiate the print medium 110 with infrared rays using the light irradiator 1 to dry and fix the ink 131 with the heat. In this case, the printing device 100 may use any printing method, as well as inkjet printing, that can fix the ink 131 on the print medium 110 with infrared rays.

The light irradiator 1 in the present embodiment is included in the printing device 100 that uses the inkjet heads as the printing unit 130. However, the light irradiator 1 may be included in any of various resin curing systems, including a system for applying a paste that contains a photosensitive resin (e.g., a photoresist) to a target surface with spin coating or screen printing and then curing the coated or printed photosensitive resin. In some embodiments, the light irradiator 1 may be used as a light source in an exposure system that exposes, for example, a photoresist to light.

Although embodiments of the present disclosure have been described in detail, the present disclosure is not limited to the embodiments described above, and may be changed or modified in various manners without departing from the spirit and scope of the present disclosure.

REFERENCE SIGNS LIST 1 light irradiator
2 housing
2a first surface
2b second surface
2c third surface
3 irradiation opening
4 vent
4a first vent
4b second vent
6 connector
7 light source
9 heat-dissipating member (heat sink)
9a recess
10 drive circuit
11 drive (drive substrate)
12 blower (cooling fan)
13 wiring member
14 slit
100 printing device
110 print medium
120 feeder
130 printing unit (inkjet head)

The invention claimed is:

1. A light irradiator, comprising:
a light source including a plurality of light-emitting elements;
a heat-dissipating member thermally connected to the light source;
a drive including a drive circuit for the light source;
a housing accommodating the light source, the heat-dissipating member, and the drive, the housing having a plurality of vents and an irradiation opening to allow light from the light source to pass; and
a blower configured to blow air to generate airflow into and out of the housing through the plurality of vents, wherein the housing is rectangular and includes
a first surface having a first side with a first dimension and a second side with a second dimension greater than the first dimension,
a second surface having the second side and a third side with a third dimension greater than the second dimension, and
a third surface having the first side and the third side,
the irradiation opening is in the first surface, the plurality of vents includes a first vent and a second vent in the second surface, the first vent is located nearer the irradiation opening than the second vent, and the second vent is located near an opposite end from the irradiation opening, and
the light source is located adjacent to the irradiation opening, the heat-dissipating member faces the first vent, the drive is located between the first vent and the second vent, and the blower faces the second vent.

2. The light irradiator according to claim 1, wherein
the drive in the housing is located adjacent to the second surface with the drive circuit facing inward in the housing.

3. The light irradiator according to claim 2, wherein
the light source is connected to the drive with a flexible wiring member including a plurality of wires extending along the heat-dissipating member, and the wiring member has a slit between the plurality of wires in an area of airflow generated by the blower.

4. The light irradiator according to claim 1, wherein
the heat-dissipating member occupies, in the housing, a space extending in a direction along the first side, and the heat-dissipating member has a recess recessed in the direction along the first side and facing the first vent.

5. A printing device comprising:
the light irradiator according to claim 1;
a feeder configured to feed a print medium to be irradiated with light emitted from the light irradiator through the irradiation opening; and
a printing unit upstream from the light irradiator in a feed direction of the print medium.

* * * * *